United States Patent [19]

Okada et al.

[11] Patent Number: 5,083,186

[45] Date of Patent: Jan. 21, 1992

[54] SEMICONDUCTOR DEVICE LEAD FRAME WITH ROUNDED EDGES

[75] Inventors: Kazuhisa Okada; Akihiro Okamoto, both of Itami, Japan

[73] Assignee: Mitsubishi Denki Kabushiki Kaisha, Japan

[21] Appl. No.: 535,070

[22] Filed: Jun. 8, 1990

[30] Foreign Application Priority Data

Apr. 12, 1990 [JP] Japan .................... 2-94952

[51] Int. Cl.⁵ .............. H01L 23/48; H01L 23/28; H01L 29/44; H01L 21/60
[52] U.S. Cl. ..................... 357/70; 357/68; 357/72; 357/65; 437/220
[58] Field of Search ............. 357/70, 68, 72; 437/220

[56] References Cited

U.S. PATENT DOCUMENTS

| 4,298,883 | 11/1981 | Komatsu et al. | 357/70 |
| 4,707,418 | 11/1987 | Takiar et al. | 357/70 |
| 4,942,452 | 7/1990 | Kitano et al. | 357/70 |

FOREIGN PATENT DOCUMENTS

| 61-156845 | 7/1986 | Japan | 357/70 |
| 61-259556 | 11/1986 | Japan | 357/70 |
| 63-37954 | 2/1987 | Japan | 357/70 |
| 1186662 | 7/1989 | Japan | 357/70 |
| 2105559 | 4/1990 | Japan | 357/70 |

*Primary Examiner*—Andrew J. James
*Assistant Examiner*—Cynthia S. Deal
*Attorney, Agent, or Firm*—Leydig, Voit & Mayer

[57] ABSTRACT

A leadframe including a die pad and inner leads the die pad having a substantially rounded edge configuration with no sharp edge, and the inner leads each having a trapezoidal cross-sectional configuration. In this construction, stresses are not concentrated in the end portion of the die pad due to temperature stresses and therefore, no cracks are formed in the resin encapsulating ICs. Accordingly, highly reliable ICS can be provided.

2 Claims, 2 Drawing Sheets

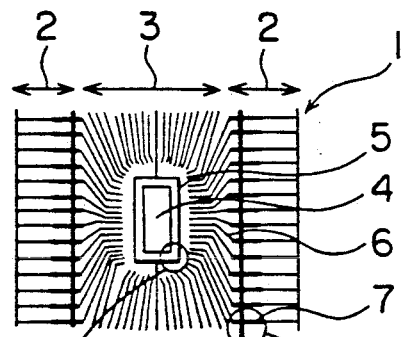
FIG. 1 PRIOR ART
FIG. 2 PRIOR ART
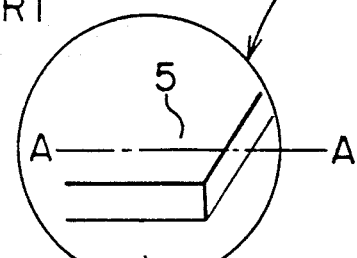
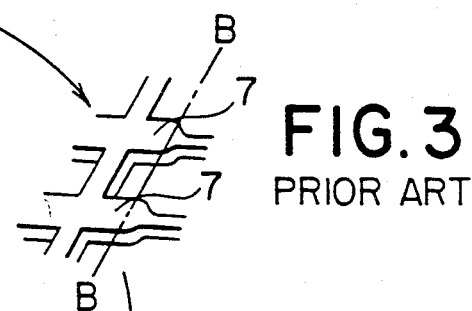
FIG. 3 PRIOR ART
FIG. 4 PRIOR ART
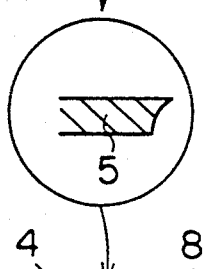
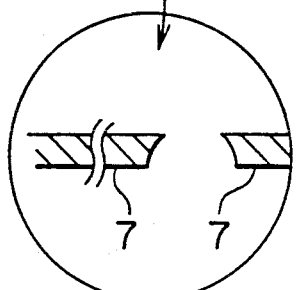
FIG. 5 PRIOR ART
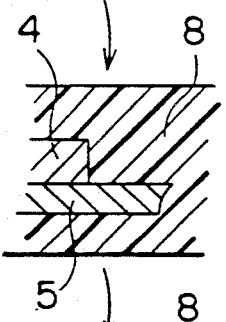
FIG. 6 PRIOR ART
FIG. 7 PRIOR ART
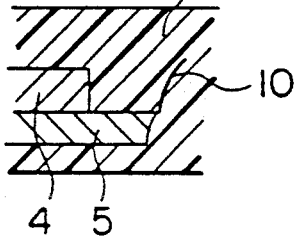
FIG. 9 PRIOR ART
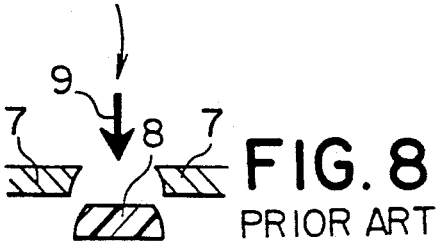
FIG. 8 PRIOR ART

SEMICONDUCTOR DEVICE LEAD FRAME WITH ROUNDED EDGES

BACKGROUND OF THE INVENTION

1. Field of the Invention

This invention relates generally to a leadframe for a semiconductor device and a method of producing the same and, more particularly, to a leadframe preventing cracking from occurring within resin encapsulating an IC mounted on a leadframe and a method of producing such a leadframe.

2. Description of the Related Art

FIG. 1 is a schematic plan view showing the leadframe for a conventional resin molded IC. As illustrated, a leadframe 1 includes an outer lead portion 2 for forming electrode outside a package and an inner lead portion 3 packaging within a molding resin. A die pad 5 is provided in the middle of the inner lead portion 3, and a semiconductor chip, that is, an IC chip 4, is mounted on the die pad 5. An inner lead and an outer lead are denoted by reference numerals 6 and 7, respectively.

The conventional leadframe 1 has the above-described construction, and a particular end portion of the die pad 5 and a portion of the outer lead 7 are shown on an enlarged scale in FIGS. 2 and 3, respectively. FIG. 4 is a cross-sectional view taken along line A—A of the end portion of the die pad 5 shown in FIG. 2, while FIG. 5 is a cross-sectional view taken along line B—B of the portion of the outer lead 7 shown in FIG. 3. As shown in these drawings, each of the outer leads 7 has a trapezoidal cross-sectional configuration in which the upper base of the trapezoid is longer than the lower base. Although it is necessary to remove extra molding resin which will flow out after the IC chip 4 has been sealed with the molding resin, such a trapezoidal cross-sectional configuration makes it possible to easily remove the extra portion by punching from above. The die pad 5 has also a similar configuration in cross section.

In the leadframe 1 described above, each of the outer leads 7 has a cross-sectional configuration in which the upper base of the trapezoid is longer than the lower base. This is because, after the semiconductor device 4 and the leadframe 1 have been sealed with a molding resin 8 as shown in FIG. 6, the molding resin 8 which remains between the outer leads 7 as shown in FIG. 7 can easily be removed by the application of pressure as indicated by arrow 9 in FIG. 8. Such a conventional leadframe 1 is produced by applying a mask whose top face is slightly larger than a bottom face to the entire surface of a thin sheet of leadframe material and etching that entire surface. Accordingly, all the inner leads 6 as well as the die pad 5 are formed to have trapezoidal cross-sectional configurations in each of which the upper base is longer than the lower base. This leads to the problem that cracks 10 are easily formed in the molding resin 8 as shown in FIG. 9 due to stresses caused by the shrinkage of the molding resin 8 and temperature stresses occurring in a product IC when in use.

SUMMARY OF THE INVENTION

It is, therefore, an object of the present invention to provide a leadframe solving the abovedescribed problems.

It is another object of the present invention to provide a leadframe for easy removal of any unnecessary molding resin which may remain between outer leads after resin molding.

It is another object of the present invention to provide a leadframe in which no stress concentration occurs in the end portion of a die pad and no cracks are formed in the molding resin, whereby the quality of ICs is improved.

To achieve the above objects, in accordance with one aspect of the present invention, there is provided a leadframe for a semiconductor device comprising: a die pad having one face on which a semiconductor device is mounted and end portions each having a substantially rounded cross-sectional configuration with no sharp edge; inner leads disposed around the die pad; and outer leads connected to corresponding ones of the inner leads and having trapezoidal cross-sectional configurations in each of which the upper base is longer than the lower base.

In accordance with another aspect of the present invention, there is provided a method of producing a leadframe for a semiconductor device comprising the steps of: applying masks having the same shape and size to the top and bottom faces of a die pad and an inner lead portion, respectively, the masks having a size approximately equal to the corresponding face; applying masks having a predetermined size to the top and bottom faces of an outer lead portion, the mask applied to the bottom face being slightly smaller than the mask applied to the top face; and etching the die pad, the inner lead portion and the outer lead portion.

The above and other objects, features and advantages of the present invention will be apparent from the following description of a preferred embodiment of the invention with reference to the accompanying drawings.

BRIEF DESCRIPTION OF THE DRAWINGS

FIG. 1 is a schematic plan view showing a conventional leadframe for a semiconductor device;

FIG. 2 is an enlarged schematic view showing one end portion of the die pad of the leadframe shown in FIG. 1;

FIG. 3 is an enlarged perspective view showing a portion of the outer leads of the leadframe shown in FIG. 1;

FIG. 4 is a cross-sectional view taken along line A—A of the die pad shown in FIG. 2;

FIG. 5 is a cross-sectional view taken along line B—B of the outer leads shown in FIG. 3;

FIG. 6 is a cross-sectional view showing a semiconductor device mounted on a leadframe and sealed with a molding resin;

FIG. 7 is a cross-sectional view showing a molding resin remaining between external leads;

FIG. 8 is a cross-sectional view showing the manner of removing the molding resin which remains between the external leads;

FIG. 9 is a cross-sectional view showing cracks formed in the molding resin shown in FIG. 6;

DESCRIPTION OF THE PREFERRED EMBODIMENT

Figure 10:
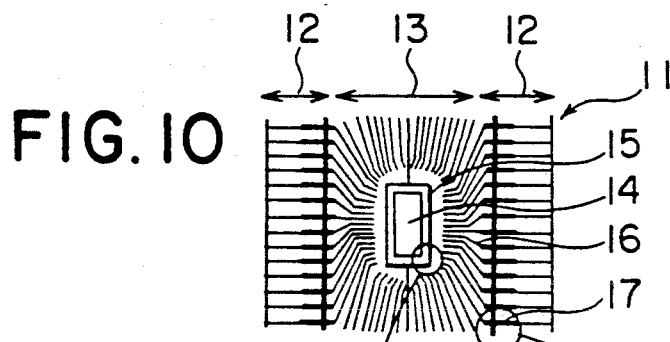
FIG. 10 is a schematic plan view showing a leadframe for a semiconductor device according to one embodiment of the present invention.

FIG. 10 is a schematic plan view showing a leadframe for a semiconductor device according to one embodiment of the present invention. As illustrated, a leadframe 11 includes an outer lead portion 12 for forming electrode terminals and an inner lead portion 13 for packaging within a molding resin. A die pad 15 is provided in the middle of the inner lead portion 13, and a semiconductor chip, that is, an IC chip 14, is mounted on the die pad 15. An inner lead and an outer lead are denoted by reference numerals 16 and 17, respectively.

Figure 11:
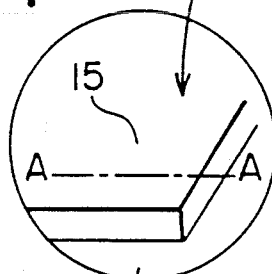
FIG. 11 is an enlarged schematic view showing one end portion of the die pad of the leadframe shown in FIG. 10.
Figure 12:
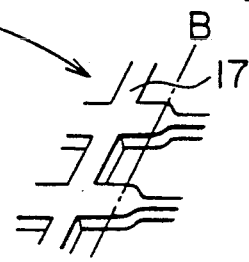
FIG. 12 is an enlarged perspective view showing a portion of the outer leads of the leadframe shown in FIG. 10.
Figure 13:
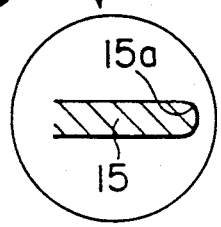
FIG. 13 is a cross-sectional view taken along line A—A of the die pad shown in FIG. 11.
Figure 14:
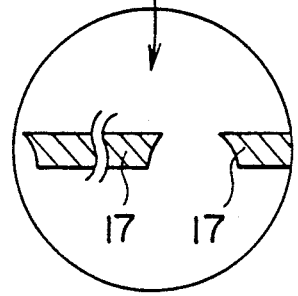
FIG. 14 is a cross-sectional view taken along line B—B of the outer leads shown in FIG. 12.

The leadframe 11 has the above-described construction, and a particular end portion of the die pad 5 and a portion of the outer lead 17 are shown on an enlarged scale in FIG. 11 and 12, respectively. FIG. 13 is a cross-sectional view taken along line A—A of the end portion of the die pad 15 shown in FIG. 11, while FIG. 14 is a cross-sectional view taken along line B—B of the portion of the outer lead 17 shown in FIG. 12.

As shown in FIG. 13, the end portion 15a of the die pad 15 is formed into a substantially rounded configuration having no sharp edge. Accordingly, even if an IC is produced by mounting the IC chip 14 on the die pad 15 and packaging this assembly with a molding resin (not shown), substantial stress concentration does not occur at the end portion of the die pad 15 and no cracks are formed in the molding resin when the IC is in use. The end portion of inner leads 13 are also formed into a substantially rounded configuration having no sharp edge, thereby preventing cracks. Each of the outer leads 17 has a trapezoidal cross-sectional configuration the upper base of which is longer than the lower base. Although it is necessary to remove extra molding resin which will flow after the IC chip 4 has been sealed with a molding resin, such a trapezoidal cross-sectional configuration makes it possible to easily remove the extra portion by punching from above.

The above-described leadframe 11 is produced as follows. The top and bottom faces of the die pad 15 and the top and bottom faces of the inner lead portion 13 are covered with masks, respectively. Each of the masks has a predetermined size approximately equal to the corresponding face. The top face of the outer lead portion 12 is covered with a mask having a predetermined size, while the bottom face is covered with a mask the size of which is slightly smaller than the mask for the top face. Then, all the surfaces of the die pad 15, the inner lead portion 13 and the outer lead portion 12 are etched, thereby preparing the leadframe 11.

Although, in the above embodiment, the end portions of the die pad 15 and the inner leads 16 are each formed to have a substantially rounded cross-sectional configuration with no sharp edge, the end portion of the die pad 15 may only be formed into such an edge-less cross-sectional configuration. Even this construction, effectively prevents cracks from occurring in the molding resin.

Figure 15:
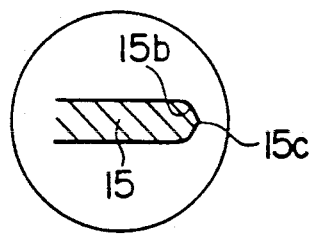
FIG. 15 is a cross-sectional view showing one end portion of the die pad of a leadframe according to another embodiment of the present invention.
Figure 16:
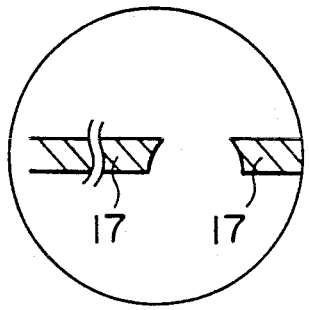
FIG. 16 is a cross-sectional view showing a portion of the outer leads of the leadframe according to another embodiment of the present invention.

Under particular etching conditions, the end portion of the die pad 15 may be formed like an end portion 15b having a central projection 15c, as shown in cross section in FIG. 15. However, it is, of course, possible to similarly effectively prevent cracks from occurring in the molding resin.

While the present invention has been described with respect to what is presently considered to be the preferred embodiment, it is to be understood that the invention is not limited to the disclosed embodiment. To the contrary, the present invention is intended to cover various modifications and equivalent arrangeents included within the spirit and appended claims. The scope of the following claims are to be accorded the broadest interpretation and encompass all such modifications and equivalent constructions.

What is claimed is:

1. A leadframe for a semiconductor device comprising:
   a die pad having opposed first and second faces on which a semiconductor device may be mounted and side surfaces extending between said first and second faces wherein said side surfaces have a substantially rounded configuration in a cross-section taken substantially perpendicular to the first face;
   a plurality of inner leads, each inner lead having an end disposed adjacent said die pad; and
   a plurality of outer leads, each outer lead being connected to a corresponding inner lead and having a trapezoidal cross-sectional configuration.

2. A leadframe according to claim 1 wherein the end of each of said inner leads has a substantially rounded cross-sectional edge configuration with no sharp edge.

* * * * *